(12) United States Patent
Harris et al.

(10) Patent No.: US 6,373,087 B1
(45) Date of Patent: Apr. 16, 2002

(54) METHODS OF FABRICATING A METAL-OXIDE-METAL CAPACITOR AND ASSOCIATED APPARATUSES

(75) Inventors: Edward Belden Harris; Yifeng Winston Yan; Sailesh Mansinh Merchant, all of Orlando, FL (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/652,479

(22) Filed: Aug. 31, 2000

(51) Int. Cl.[7] .................................. H01L 31/119
(52) U.S. Cl. ........................ 257/301; 257/304
(58) Field of Search .................. 438/239, 243–246, 438/250, 386–388; 257/301–305

(56) References Cited

U.S. PATENT DOCUMENTS

| | | | |
|---|---|---|---|
| 5,576,240 A | | 11/1996 | Radosevich et al. |
| 6,100,155 A | * | 8/2000 | Hu .............................. 438/386 |
| 6,130,150 A | * | 10/2000 | Merchant et al. ........... 438/618 |

* cited by examiner

*Primary Examiner*—David Nelms
*Assistant Examiner*—David Vu
(74) *Attorney, Agent, or Firm*—Alston & Bird LLP

(57) ABSTRACT

A method of fabricating a metal-oxide-metal capacitor in a microelectronic device is provided. First, a recess is formed in a surface of a dielectric layer deposited over a microelectronic substrate. A first barrier layer is then deposited over the dielectric layer such that the first barrier layer conforms to the recess. A first conductive element is then deposited over the first barrier layer so as to at least fill the recess. A second barrier layer is further deposited over the first conductive element such that the first barrier layer and the second barrier layer cooperate to encapsulate the first conductive element. The first conductive element thus comprises a first plate of the capacitor. A capacitor dielectric layer is then deposited over the second barrier layer, followed by the deposition of a second conductive element over the capacitor dielectric layer. The second conductive element thus comprises a second plate of the capacitor. In one embodiment, the dielectric layer may be comprised of an oxide and the barrier layers are comprised of, for example, tantalum; tantalum nitride; titanium nitride; tungsten nitride; silicon nitrides of tantalum, titanium, and tungsten; and combinations thereof. The first conductive element is preferably comprised of copper. The capacitor dielectric may be comprised of an oxide or tantalum pentoxide, while the second conductive element may be comprised of a layer of an aluminum alloy disposed between two barrier layers, each comprised of, for example, tantalum; tantalum nitride; titanium nitride; tungsten nitride; silicon nitrides of tantalum, titanium, and tungsten; and combinations thereof. Associated apparatuses are also provided.

6 Claims, 4 Drawing Sheets

METHODS OF FABRICATING A METAL-OXIDE-METAL CAPACITOR AND ASSOCIATED APPARATUSES

FIELD OF THE INVENTION

The present invention relates to a method of fabricating a capacitor in a semiconductor device and, more particularly, to methods of fabricating a metal-oxide-metal capacitor in a metal-oxide semiconductor device and associated apparatuses.

BACKGROUND OF THE INVENTION

Capacitors are commonly used in electronic devices for storing electrical charge. Typically, a capacitor consists of an insulator or dielectric material sandwiched between parallel conductive plates. When a voltage differential is applied across the plates, a certain electrical charge is stored by the insulator, wherein the amount of electrical charge is known as the capacitance of the capacitor. The capacitance is generally measured in units of farads and corresponds to the amount of charge stored by the capacitor per the applied voltage. The capacitance of the capacitor may be affected by various factors including the surface area of the plates contacting the insulator, the thickness of the insulator (the distance between the plates), and the dielectric constant of the insulator. Although capacitors are commonly used in macroelectronics applications, capacitors may also be used in various microelectronics applications such as in electrical filters, analog-to-digital converters, and other microelectronic devices.

A particular example of a capacitor adapted to microelectronics applications is a metal-oxide-metal (MOM) capacitor, typically used in, for example, analog semiconductor devices and the like. An example of a process for fabricating MOM capacitors is disclosed in, for example, U.S. Pat. No. 5,576,240 to Radosevich et al., assigned to Lucent Technologies Inc., also the assignee of the present invention, and incorporated herein by reference. The Radosevich '240 patent discloses a method of fabricating a metal to metal capacitor which comprises a layer of titanium/titanium nitride deposited on a polysilicon which has been patterned with interlevel dielectrics. A capacitor dielectric is then deposited, followed by the deposition of an aluminum layer. Interspersed between the deposition steps are appropriate patterning and etching steps for defining the capacitor. Such a MOM capacitor exemplifies a relatively inexpensive design that is typically compatible with back-end wiring processes.

However, an ongoing trend in the production of semiconductor devices is the move toward devices with progressively smaller features, wherein a feature may comprise, for example, a capacitor as described herein. Popular techniques for forming metallic features in semiconductor devices involves deposition of a metallic layer over a substrate, followed by subsequent photolithographical patterning and etching steps to produce the desired configuration of the metallic feature as described in, for example, the Radosevich '240 patent. Metals such as aluminum that are typically used for these metallization processes are capable of forming the desired features and are relatively easy to process. However, as the size of a metallic structure decreases, it is often more difficult to obtain the desired configuration of the feature with standard deposition, patterning, and etching techniques. In addition, reduction in the size of metallic features often results in, for example, a detrimental increase in the resistivity of the feature. An increase in the resistivity of the metallic components may, for instance, further lead to a deleterious reduction in the processing speed of the device. Further, a metal such as aluminum may have a relatively low melting point. Thus, after the deposition of an aluminum metallization layer, subsequent processing steps must often be performed at temperatures under a specific limit in order to avoid damage to a previously formed aluminum metallization layer.

One solution to these shortcomings has been to use another metal, such as copper, for certain metallization processes. Copper has a lower resistivity which allows for the formation of smaller features than with aluminum metallization. Copper also has a higher melting point relative to aluminum such that subsequent device processing steps may be performed at higher temperatures. However, the typical deposition, patterning and etch processes are not as effective for copper metallization processes as they are for aluminum metallization processes. Generally, adaptation of these standard processes to copper metallization is relatively difficult and often cost prohibitive. For example, it would not be feasible to simply replace the titanium/titanium nitride layer in the Radosevich '240 device with a copper layer due to, for instance, difficulties associated with the etching of copper. Further, a metal such as copper may have a tendency to diffuse ions of the metal into any surrounding insulating or dielectric structure, thereby leading to leakage or other undesirable results. Thus, there exists a need for a metallization process in the production of metal-oxide semiconductor devices wherein a metal other than aluminum, such as copper, can be relatively easily applied in a cost effective manner to form metallic features in the device while permitting flexibility in the miniaturization of such features.

As with any fabrication process, a simpler process is generally more advantageous. Thus, a fabrication method which can achieve the same or better quality product with about the same material cost and with the same or fewer processing steps is highly preferred, especially if elimination of steps in the fabrication process reduces labor costs and eliminates the need for expensive manufacturing equipment. In addition, it is generally desirable to retain flexibility in the fabrication process for semiconductor devices such as integrated circuits. More particularly, it is advantageous to have a modular process for forming a capacitor wherein the modular capacitor formation process may be added as an option at various stages in the fabrication of the integrated circuit, without major changes in the sequence of the fabrication processes.

Thus, it would be advantageous to have a metallization process in the production of metal-oxide semiconductor devices wherein a metal other than aluminum, such as copper, can be relatively easily applied in a cost effective manner to form metallic features while permitting flexibility in the miniaturization of such features. This process should be simple, modular, and flexible, while producing an improved semiconductor device.

SUMMARY OF THE INVENTION

The above and other needs are met by the present invention which, in one embodiment, provides a method of fabricating a capacitor in a microelectronic device. First, a recess is formed in a surface of a dielectric layer deposited over a microelectronic substrate. A first barrier layer is then deposited over the dielectric layer such that the first barrier layer conforms to the recess. A first conductive element is then deposited over the first barrier layer so as to at least fill the recess. A second barrier layer is then deposited over the first conductive element such that the first barrier layer and the second barrier layer cooperate to encapsulate the first conductive element. The first conductive element thus comprises a first plate of the capacitor. A capacitor dielectric layer is then deposited over the second barrier layer, followed by the deposition of a conductive second conductive element over the capacitor dielectric layer. The second conductive element thus comprises a second plate of the capacitor.

In one advantageous embodiment, the dielectric layer comprises an oxide layer and the microelectronic substrate comprises a silicon substrate, wherein forming a recess thereby further comprises forming an oxide layer on a surface of a silicon substrate. In such an instance, the recess is formed in the oxide layer by an oxide etch process. The first and second barrier layers encapsulating the first conductive element may be comprised of, for example, tantalum; tantalum nitride; titanium nitride; tungsten nitride; silicon nitrides of tantalum, titanium, and tungsten; and combinations thereof. Generally, the first and the second barrier layer may be deposited by, for example, a sputter deposition process. In some instances, a seed layer may be deposited on the first barrier layer before the first conductive element is deposited. In one particularly advantageous embodiment, the first conductive element comprises a copper layer deposited on the first barrier layer so as to at least fill the recess, wherein the copper layer may be deposited by, for example, an electroplating process. The dielectric layer is then planarized such that the first barrier layer and the first conductive element fill the recess, but are prevented from extending outwardly therefrom. Planarizing of the dielectric layer may be accomplished by polishing the first conductive element and the first barrier layer using a chemical-mechanical polishing process such that the first conductive element and the first barrier layer fill the recess and form a coplanar surface with the dielectric layer. The first conductive element thereby forms the first plate of the capacitor.

Next, a capacitor dielectric layer is deposited over the second barrier layer, wherein the capacitor dielectric layer may comprise, for example, an oxide or tantalum pentoxide. The capacitor dielectric layer may then be etched so as to produce the desired configuration thereof for forming the capacitor, wherein the second barrier layer may be used during the etching process as an etch stop. A second conductive element, forming the second plate of the capacitor, is then deposited over the capacitor dielectric layer. In one advantageous embodiment, the second conductive element comprises a composite having a layer of an aluminum alloy disposed between barrier layers, wherein each barrier layer may be comprised of, for example, tantalum; tantalum nitride; titanium nitride; tungsten nitride; silicon nitrides of tantalum, titanium, and tungsten; and combinations thereof. Once the capacitor is formed, an encapsulating dielectric layer, also known as a capping layer, may be deposited over the capacitor so as to cooperate with the dielectric layer over the microelectronic substrate to substantially encapsulate the capacitor. In some instances, the encapsulating dielectric layer may be planarized using a chemical-mechanical polishing process prior to subsequent processing steps in the formation of the semiconductor device.

A further advantageous aspect of the present invention is a metal-oxide-metal capacitor comprising a first plate, a capacitor dielectric disposed adjacent to the first plate, and a conductive second plate disposed adjacent to the capacitor dielectric. Preferably, the first plate comprises a copper component encapsulated in a conductive barrier layer, wherein the first plate is disposed in a dielectric layer formed on a microelectronic substrate. In one advantageous embodiment, the dielectric layer comprises an oxide layer and the microelectronic substrate is comprised of silicon, while the barrier layer may be comprised of, for example, tantalum; tantalum nitride; titanium nitride; tungsten nitride; silicon nitrides of tantalum, titanium, and tungsten; and combinations thereof. The capacitor dielectric may be comprised of, for example, an oxide or tantalum pentoxide. The second plate may be, in turn, comprised of, for example, a composite having a layer of an aluminum alloy disposed between two barrier layers, wherein each barrier layer may be comprised of, for example, tantalum; tantalum nitride; titanium nitride; tungsten nitride; silicon nitrides of tantalum, titanium, and tungsten; and combinations thereof. The capacitor may further comprise an encapsulating dielectric layer deposited over the capacitor which cooperates with the dielectric layer over the microelectronic substrate to substantially encapsulate the capacitor.

Thus, methods of fabricating a metal-oxide-metal capacitor according to embodiments of the present invention provide a metallization process in the production of metal-oxide semiconductor devices with copper based metallization, wherein the capacitor may utilize at least one copper plate. Methods of fabricating a capacitor according to the present invention further allow copper to be used in the formation of the capacitor wherein the copper features may be easily applied in a cost effective manner, thereby providing a simple, modular, and flexible process which promotes miniaturization of features of the capacitor while producing a capacitor capable of improved performance over prior art devices.

BRIEF DESCRIPTION OF THE DRAWINGS

Some of the advantages of the present invention having been stated, others will appear as the description proceeds, when considered in conjunction with the accompanying drawings, which are not necessarily drawn to scale, in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIGS. 1A–1G disclose a method of fabricating a capacitor in a microelectronic device according to one embodiment of the present invention. Typically, as with most semiconductor devices, a feature such as a capacitor is fabricated over a microelectronic substrate (not shown) comprising, for instance, a silicon wafer. It will be understood by those having skill in the art that when a layer or element is described herein as being over another layer or element, it may be formed directly on the layer, at the top, bottom, or side surface area thereof. Alternatively, one or more intervening layers may be provided between the layers.

Figure 1A:
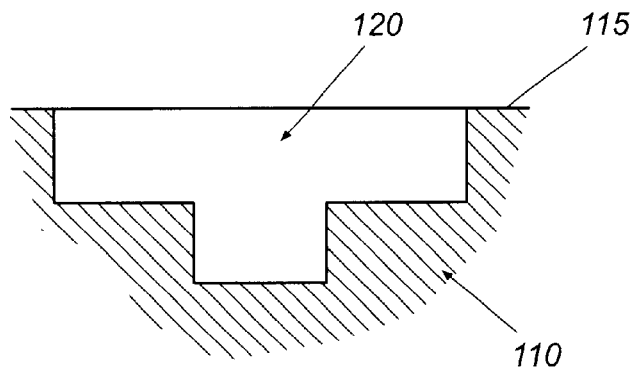
FIGS. 1A–1I are cross-sectional schematics of a method of fabricating a capacitor according to one embodiment of the present invention.

As shown in FIG. 1A, during the semiconductor device fabrication process, a dielectric layer, indicated generally by the numeral 110, is deposited over the microelectronic substrate (not shown). Generally, a recess 120 is formed in an exposed surface 115 of the dielectric layer 110. The dielectric layer 110 may be comprised of, for example, an oxide or other suitable dielectric. In instances where the dielectric layer 110 comprises an oxide, the recess 120 is formed therein by, for example, an oxide etching process. Typically, the recess 120 is formed in the dielectric layer 110 such that the recess 120 is defined in the configuration of one of the plates of the capacitor to be formed. It will be understood by those skilled in the art that the recess 120 may be formed by a variety of processes such as, for example, a damascene or dual damascene process. Accordingly, where an array of devices, such as capacitors, are being formed in a single dielectric layer 110, the dielectric layer 110 may define a series of vias and/or trenches following the oxide etch process. Depending on the desired profile of the recess 120, a wet oxide etch or a dry oxide etch may be used.

Figure 1B:
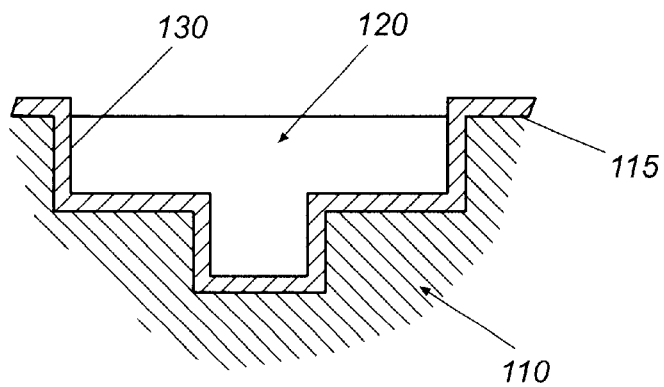

Following the formation of the recess 120 in the dielectric layer 110, a barrier layer 130 is deposited over the dielectric layer 110 so as to form a conformal coating as shown in FIG. 1B. The barrier layer 130 may be comprised of, for example, tantalum; tantalum nitride; titanium nitride; tungsten nitride; silicon nitrides of tantalum, titanium, and tungsten; and combinations thereof and deposited using a sputter deposition process. In one advantageous embodiment, a barrier layer 130 is deposited using a sputter deposition process to form a barrier layer having a conformal thickness of about 300 Angstroms.

Figure 1C:
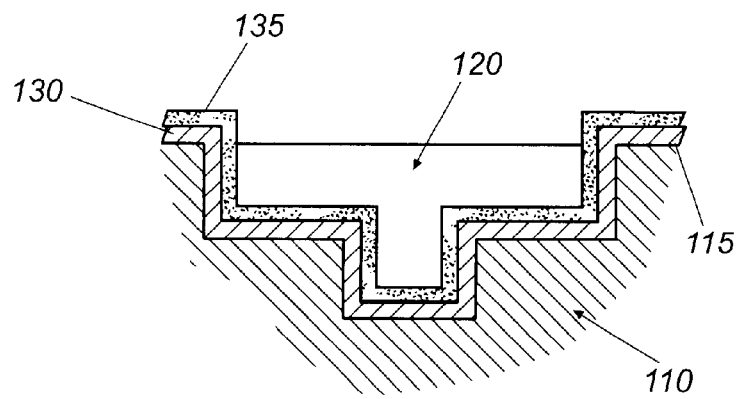

As shown in FIG. 1C, following the deposition of the barrier layer 130, a seed or conductive layer 135 is deposited over the barrier layer 130 so as to form a conformal coating. The seed layer 135 serves as an electrically conductive layer to facilitate the deposition of subsequent metallic layers. Such a seed layer 135 may comprise a variety of conductive materials as known to one skilled in the art.

Figure 1D:
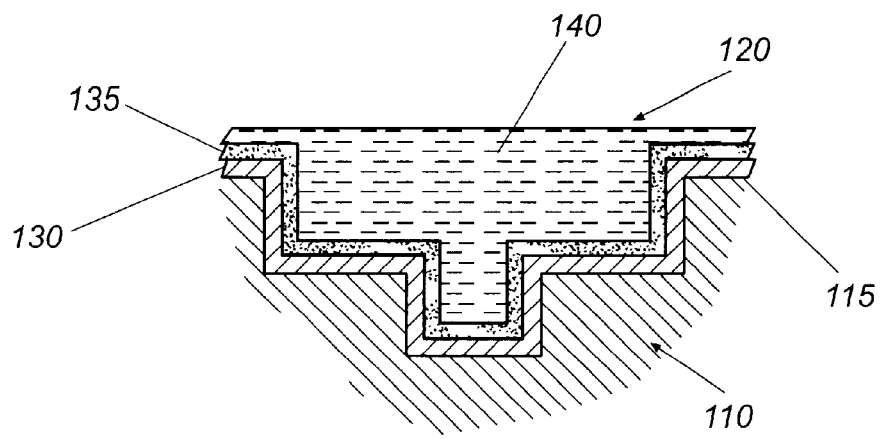

As shown in FIG. 1D, a first conductive element 140 is then deposited over the seed layer 135 so as to at least fill the recess 120. According to one particularly advantageous embodiment, the first conductive element 140 comprises copper deposited by an electroplating process. The first conductive element 140 may comprise any metal suitable for conducting and holding an electric charge, such as, for example, silver, titanium, or noble metals such as gold, platinum, paladium, and the like. It will be further understood by those skilled in the art that the first conductive element 140 may, in some instances, be deposited directly on the barrier layer 130, without a seed layer 135 therebetween, depending on the material comprising the first conductive element 140.

Figure 1E:
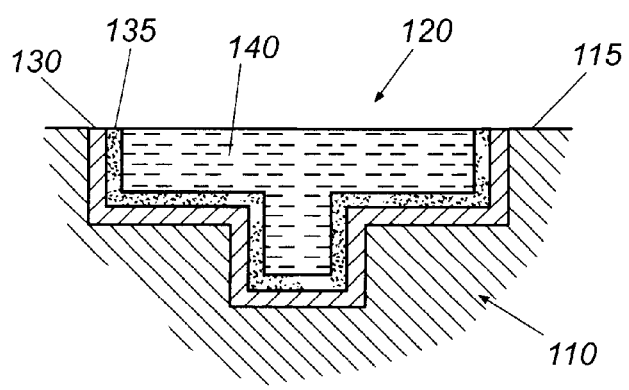

As shown in FIG. 1E, the surface of the dielectric layer 110 is then planarized such that the barrier layer 130, the seed layer 135, and the first conductive element 140 do not extend outwardly of the recess 120. According to one advantageous embodiment of the present invention, the planarization of the dielectric layer 110 is accomplished using a chemical-mechanical polishing (CMP) process such that a substantially planar surface 115 is produced, wherein the barrier layer 130, the seed layer 135, and the first conductive element 140 at least fill the recess 120 to form a coplanar surface with the dielectric layer 110. However, planarization of the dielectric layer 110 may be accomplished by other polishing techniques capable of producing the same or substantially similar results.

Figure 1F:
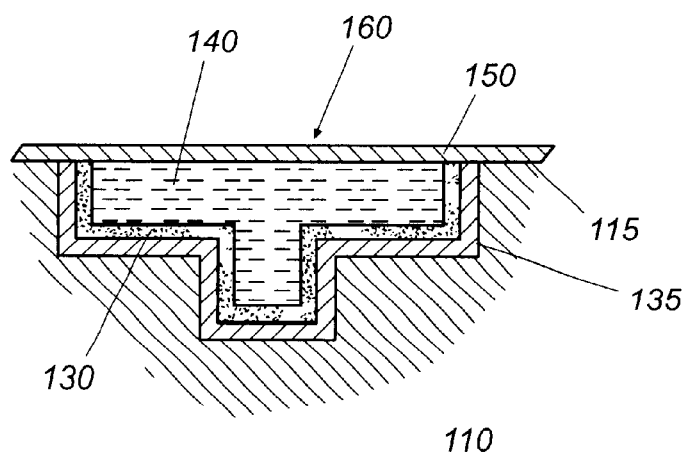

As shown in FIG. 1F, an additional barrier layer 150 is then deposited over the dielectric layer 110 so as to at least cover the barrier layer 130, the seed layer 135, and the first conductive element 140 filling the recess 120. The additional barrier layer 150 thus cooperates with the initial barrier layer 130 to encapsulate the first conductive element 140. According to one advantageous embodiment of the present invention, the additional barrier layer 150 may be comprised of, for example, tantalum; tantalum nitride; titanium nitride; tungsten nitride; silicon nitrides of tantalum, titanium, and tungsten; and combinations thereof and may have a thickness of about 300 Angstroms. The first conductive element 140 thus generally comprises a first plate 160 of the capacitor. Where, for instance, the first conductive element 140 is comprised of copper, the encapsulating barrier layer, comprising both the initial barrier layer 130 and the additional barrier layer 150, allows electricity to be conducted through the first conductive element 140 while it prevents copper ions from migrating into the surrounding dielectric layer 110 in which the first plate 160 is formed. Smaller features of the capacitor are thereby obtainable with the first plate 160 of the capacitor formed in this manner since the dielectric layer 110 is etched to form the first plate 160 therein rather than the first plate 160 being etched from a deposited metallic layer. The use of copper to form the first plate 160 has further advantages in that the copper material provides less resistivity in smaller device features than comparable features comprised of, for example, aluminum. The use of copper at an earlier stage in the device fabrication process further allows subsequent higher temperature processes to be used in the fabrication of the device.

Figure 1G:
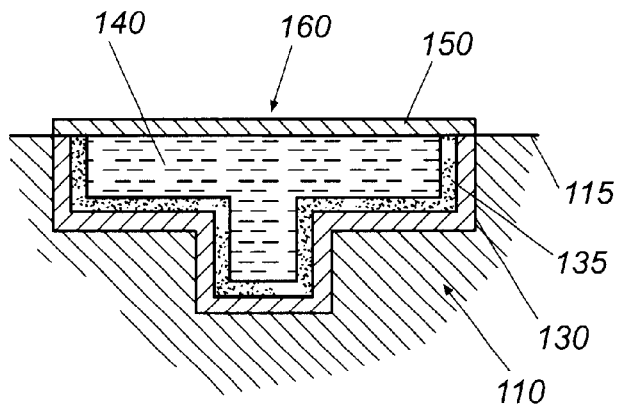
Figure 1H:
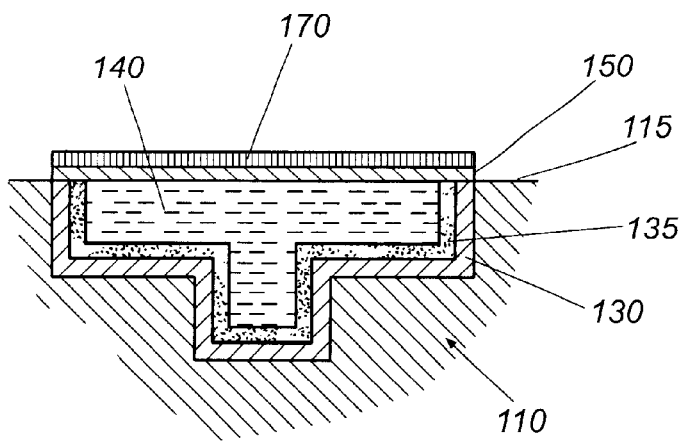

As shown in FIG. 1F, the additional barrier layer 150 may be deposited as a blanket layer before being patterned so as to, for example, correspond to the configuration of the first plate 160, as shown in FIG. 1G. A capacitor dielectric layer 170 is then deposited over the additional barrier layer 150. The capacitor dielectric layer 170 may be deposited as a blanket layer over the patterned additional barrier layer 150, wherein the capacitor dielectric layer 170 is then patterned so as to correspond to the particularly advantageous embodiment, the capacitor dielectric 170 is comprised of, for example, an oxide or tantalum pentoxide. Generally, factors such as the thickness and the dielectric constant of the capacitor dielectric 170 determine the capacitance rating of the capacitor. Thus, the capacitor dielectric 170 may be comprised of any material capable of providing, for example, good linearity wherein the capacitance of the capacitor experiences little or no change due to changes in voltage or temperature, a high dielectric constant, low leakage, and a high breakdown voltage. A capacitor dielectric 170 such as an oxide or tantalum pentoxide may be deposited over the additional barrier layer 150 by, for example, a CVD deposition process. Note that, according to an alternate embodiment, the additional barrier layer 150 may be deposited as a blanket layer, followed by the deposition of the capacitor dielectric layer 170, also as a blanket layer. The adjacent blanket layers of the additional barrier layer 150 and the capacitor dielectric layer 170 may then be concurrently patterned so as to correspond to the configuration of the first plate 160 as shown in FIG. 1H, wherein, according to either embodiment, the second barrier layer 150 may be used as an etch stop during the patterning of the capacitor dielectric layer 170.

Figure 1I:
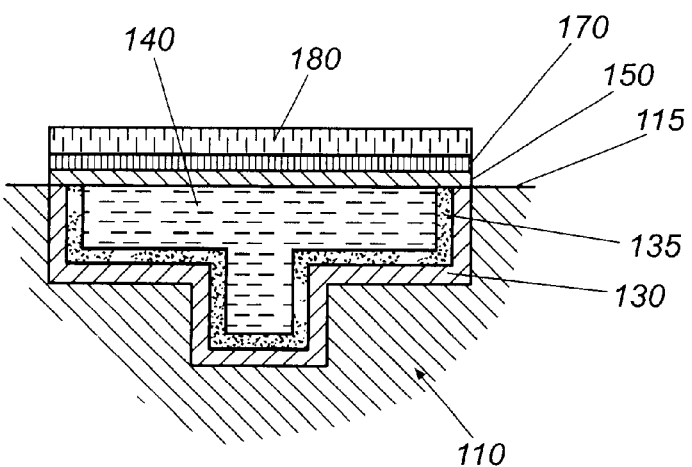

As shown in FIG. 1I, a second conductive element 180 is then deposited over the capacitor dielectric 170 following the patterning thereof The second conductive element 180 serves as the second plate of the capacitor and may be comprised of, for instance, any metal suitable for fabricating capacitors on integrated circuits. An example of a suitable metal is aluminum. However, in one particularly advantageous embodiment of the present invention, the second conductive element 180 may comprise a composite having a layer of an aluminum alloy disposed between two barrier layers (not shown). Each barrier layer may comprise, for instance, tantalum; tantalum nitride; titanium nitride; tungsten nitride; silicon nitrides of tantalum, titanium, and tungsten; and combinations thereof. Completion of the formation of the first and second plates 160, 180 and the capacitor dielectric 170 thereby achieves a configuration of a capacitor as shown in FIG. 1I.

Figure 2A:
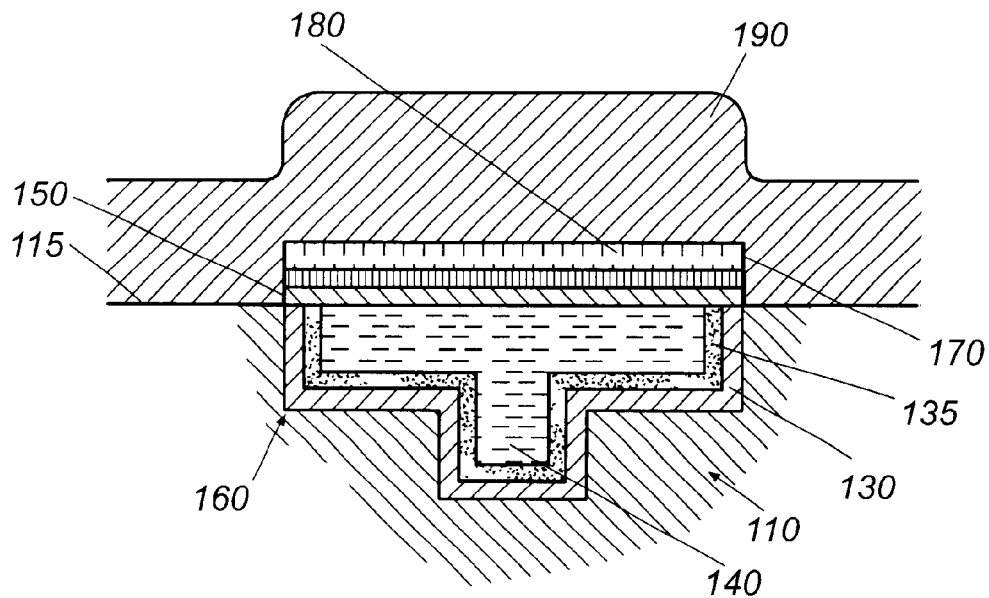
FIGS. 2A–2B are cross-sectional schematics of steps for encapsulating a capacitor fabricated according to a method of fabricating a capacitor according to one embodiment of the present invention.
Figure 2B:
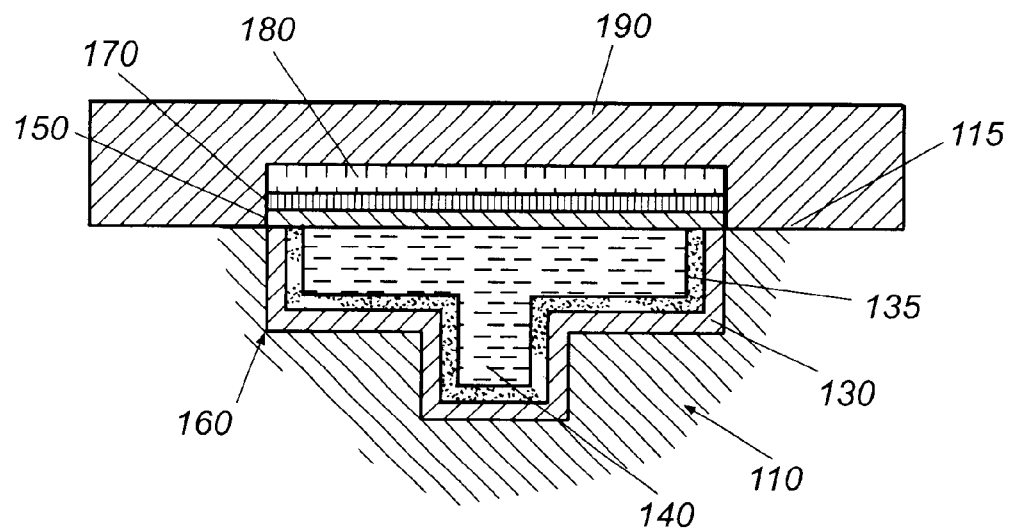

As shown in FIG. 2A, once the capacitor has been formed, subsequent dielectric layer(s) may be deposited over the capacitor to thereby encapsulate the capacitor. The encapsulating dielectric layer 190 may be comprised of, for example, silicon-based oxides, multiple layer oxide/nitride combinations, or spin-on dielectric materials such as polyimides. Generally, the encapsulating dielectric layer 190 cooperates with the initial dielectric layer 110 to encapsulate the capacitor. Electrical connections to the capacitor through the dielectric layers 110, 190 may be formed by separate processes in the device fabrication process and will not be described further herein. Since portions of the capacitor may extend above the plane of the initial dielectric layer 110 following the formation of the capacitor, the encapsulating dielectric layer 190 may have a non-planar topography when deposited over the capacitor as it conforms to the surface features thereof. Therefore, the encapsulating dielectric layer 190 may further be subjected to a subsequent dielectric chemical-mechanical polishing process to planarize the metal-oxide-metal capacitor topography. Following this procedure, the final metal-oxide-metal capacitor is obtained as shown in FIG. 2B.

Thus, methods of fabricating a metal-oxide-metal capacitor according to embodiments of the present invention provide a modular process in the production of metal-oxide semiconductor devices, preferably with copper based metallization. Methods of fabricating a capacitor according to the present invention further allow copper to be used in the formation of the capacitor wherein the copper features may be easily applied in a cost effective manner, thereby providing a simple, modular, and flexible process which promotes miniaturization of features of the capacitor without sacrificing performance of the capacitor compared to prior art capacitors. Methods of fabricating a metal-oxide-metal capacitor in metal-oxide semiconductor devices with copper metallization according to embodiments of the present invention thus provide distinct advantages over prior art metal-oxide-metal capacitor fabrication methods as described herein.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A metal-oxide-metal capacitor comprising:
   a first plate having a copper component encapsulated in a barrier layer, the first plate being disposed in a dielectric layer formed on a microelectronic substrate;
   a capacitor dielectric disposed adjacent to the first plate; and
   a conductive second plate disposed adjacent to the capacitor dielectric.

2. A capacitor according to claim 1 wherein the barrier layer comprises at least one of tantalum; tantalum nitride; titanium nitride; tungsten nitride; silicon nitrides of tantalum, titanium, and tungsten; and combinations thereof.

3. A capacitor according to claim 1 wherein the dielectric layer comprises an oxide layer and the microelectronic substrate is comprised of silicon.

4. A capacitor according to claim 1 wherein the capacitor dielectric is comprised of at least one of an oxide and tantalum pentoxide.

5. A capacitor according to claim 1 wherein the second plate is comprised of a composite having a layer of an aluminum alloy disposed between two barrier layers, each barrier layer comprising at least one of tantalum; tantalum nitride; titanium nitride; tungsten nitride; silicon nitrides of tantalum, titanium, and tungsten; and combinations thereof.

6. A capacitor according to claim 1 further comprising an encapsulating dielectric layer deposited over the capacitor and cooperating with the dielectric layer over the microelectronic substrate to substantially encapsulate the capacitor.

* * * * *